US00RE40579E

(19) United States
(12) Reissued Patent
Bryant et al.

(10) Patent Number: US RE40,579 E
(45) Date of Reissued Patent: Nov. 25, 2008

(54) STRUCTURE FOR TRANSISTOR DEVICES IN AN SRAM CELL

(75) Inventors: Frank Randolph Bryant, Denton, TX (US); Tsiu Chiu Chan, Carrollton, TX (US)

(73) Assignee: STMicroelectronics, Inc., Carrollton, TX (US)

(21) Appl. No.: 09/694,051

(22) Filed: Oct. 20, 2000

Related U.S. Patent Documents

Reissue of:
(64) Patent No.: 5,825,070
Issued: Oct. 20, 1998
Appl. No.: 08/712,808
Filed: Sep. 12, 1996

U.S. Applications:
(60) Continuation-in-part of application No. 08/390,117, filed on Feb. 17, 1995, now abandoned, which is a division of application No. 08/159,462, filed on Nov. 30, 1993, now Pat. No. 5,426,065.

(51) Int. Cl.
*H01L 29/76* (2006.01)
*H01L 29/94* (2006.01)
*H01L 31/00* (2006.01)

(52) U.S. Cl. ..... 257/392; 257/379; 257/903; 257/904

(58) Field of Classification Search ..... 257/368, 257/379, 392, 903, 904, E27.098, E21.661
See application file for complete search history.

(56) References Cited

U.S. PATENT DOCUMENTS 4,866,002 A * 9/1989 Shizukuishi et al. ..... 438/217
5,285,096 A * 2/1994 Ando et al. ..... 257/379
5,373,170 A * 12/1994 Pfiester et al. ..... 257/69

* cited by examiner

*Primary Examiner*—Ngan Ngo
(74) *Attorney, Agent, or Firm*—Lisa K. Jorgenson; Bryan A. Santarelli

(57) ABSTRACT

An SRAM memory cell having first and second transfer gate transistors. The first transfer gate transistor includes a first source/drain connected to a bit line and the second transfer gate transistor has a first source/drain connected to a complement bit line. Each transfer gate transistor has a gate connected to a word line. The SRAM memory cell also includes first and second pull-down transistors configured as a storage latch. The first pull-down transistor has a first source/drain connected to a second source/drain of said first transfer gate transistor; the second pull-down transistor has a first source/drain connected to a second source/drain of said second transfer gate transistor. Both first and second pull-down transistors have a second source/drain connected to a power supply voltage node. The first and second transfer gate transistors each include a gate oxide layer having a first thickness, and the first and second pull-down transistors each include a gate oxide layer having a second thickness, wherein and the first thickness is different from the second thickness.

22 Claims, 7 Drawing Sheets

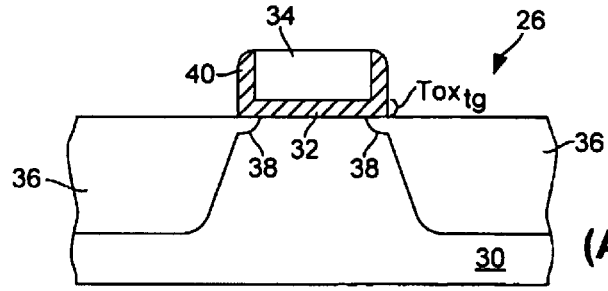
FIG. 3A (AMENDED)
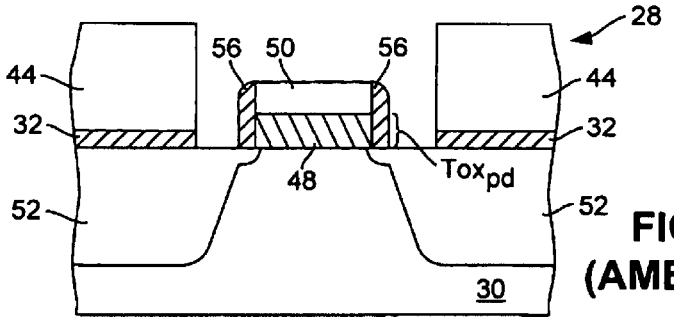
FIG. 3E (AMENDED)

STRUCTURE FOR TRANSISTOR DEVICES IN AN SRAM CELL

Matter enclosed in heavy brackets [ ] appears in the original patent but forms no part of this reissue specification; matter printed in italics indicates the additions made by reissue.

CROSS REFERENCE TO RELATED APPLICATION

This application is a continuation in part of an application entitled "METHOD OF MAKING TRANSISTOR DEVICES IN AN SRAM CELL", Ser. No. 08/390,117, filing date Feb. 17, 1995 *now abandoned*, which is a divisional of Ser. No. 08/159,462 filed Nov. 30, 1993, now U.S. Pat. No. 5,426,065.

Applicant incorporates said application Ser. No. 08/159,462 by reference herein and claims the benefit of said application for all purposes pursuant to 37 C. F. R. § 1.78.

BACKGROUND OF THE INVENTION

1. Field of the Invention

The present invention relates to integrated the circuit devices and more specifically to field effect transistors (FET) for use in integrated circuits.

2. Description of the Prior Art

Memories are devices that respond to operational orders, usually from a central processing unit. Memories may store large quantities of information in a digital format. In a memory system or unit, addresses are used to access the contents of the memory unit. A binary digit, also called a bit, is the basic information element stored in a memory unit. The smallest subdivision of a memory unit into which a bit of information can be stored is called a memory cell. A memory on a chip is physically arranged as a two-dimensional array of cells, wherein rows of cells are connected by row lines, also called word lines. A column of cells are connected by a column line, also called a bit line. These memory cells may be constructed by various configurations of transistors and/or capacitors.

A semiconductor memory is a memory that is implemented in a semiconductor material such as silicon. Metal-oxide semiconductor (MOS) memories are common in the industry. A number of different types of MOS memories exist, such as a dynamic random access memory (DRAM) which is a metal oxide semiconductor memory that stores a bit of information as a charge on a capacitor, and a static random access memory (SRAM) which includes a bistable flipflop circuit requiring only a DC voltage applied to it to retain its memory. Normally, an SRAM contains four transistors plus either two transistors or two polysilicon load resistors as pull-up devices.

SRAMs have a disadvantage over a memory such as a DRAM. The components in an SRAM typically require the SRAM to have a larger basic cell than a DRAM. In SRAM memory cells, the data transfer gate transistor to pull-down transistor ON resistance ratio is typically required to be about 2.6× or greater to provide stability to the memory cell. Currently, the width of the pull-down transistor is required to be larger than the width of the transfer gate transistor to achieve the ratio requirement. This requirement places limitations on how small the memory cell may be made. Therefore, it would be desirable to have a transistor structure that would allow for a reduction in the area that a memory cell requires.

SUMMARY OF THE INVENTION

An SRAM memory cell having first and second transfer gate transistors. The first transfer gate transistor includes a first source/drain connected to a bit line and the second transfer gate transistor has a first source/drain connected to a complement bit line. Each transfer gate transistor has a gate connected to a word line. The SRAM memory cell also includes first and second pull-down transistors configured as a storage latch. The first pull-down transistor has a first source/drain connected to a second source/drain of said first transfer gate transistor; the second pull-down transistor has a first source/drain connected to a second source/drain of said second transfer gate transistor. Both first and second pull-down transistors have a second source/drain connected to a power supply voltage node. The first and second transfer gate transistors each include a gate oxide layer having a first thickness, and the first and second pull-down transistors each include a gate oxide layer having a second thickness, wherein the first thickness is different from the second thickness.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 3A–3E are schematic cross-section views of a transfer gate transistor and pull-down transistor in an SRAM cell during processing.

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections and layouts of portions of an integrated circuit during fabrication are not drawn to scale, but instead are drawn so as to illustrate the important features of the invention.

Figure 1:
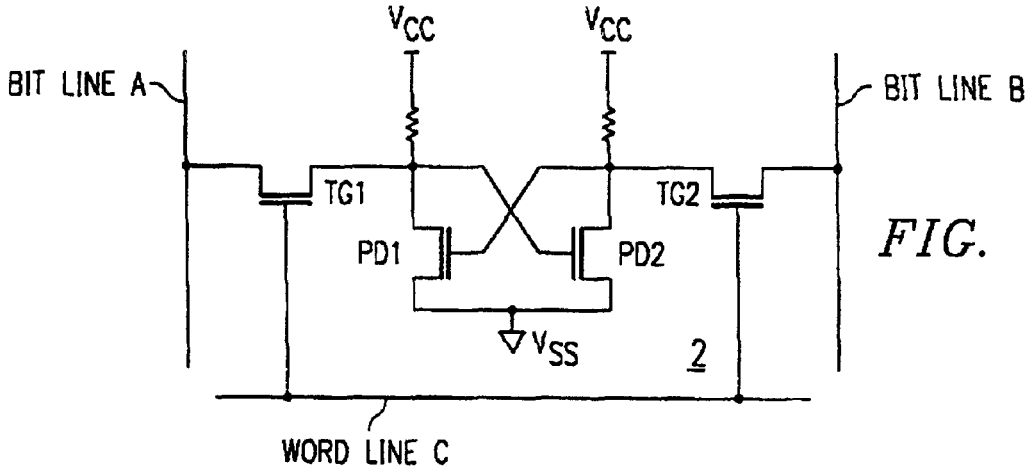
FIG. 1 is a schematic diagram of an SRAM cell in which a preferred embodiment of a present invention may be implemented.

FIG. 1 is a schematic diagram of an SRAM cell 2 in which a preferred embodiment of the present invention may be implemented. SRAM cell 2 includes transistors TG1, TG2, PD1, and PD2. SRAM cell 2 also includes resistors R1 and R2. Transistors TG1 and TG2 are transfer gate transistors in SRAM cell 2 while transistors PD1 and PD2 are pull-down transistors. Resistors R1 and R2 are used as pull-up devices.

Transistor TG1 has a source/drain connected to bit line A, and transistor TG2 has a source/drain connected to bit line B. Bit line B is a complement of bit line A. The gates of transistors TG1 and TG2 are connected to word line C. As can be seen, transistors PD1 and PD2 are connected in a cross-coupled configuration. In addition, the source/drain of transistor TG1 and transistor PD1 is connected to one end of resistor R1 while the source/drain of transistor PD2 and transistor TG2 are connected to one end of resistor R2. The other ends of resistors R1 and R2 are connected to power supply voltage VCC while transistors PD1 and PD2 each have a source/drain connected to power supply voltage VSS.

Typically, the power supply voltage VCC is at a higher voltage than power supply voltage VSS. In a typical SRAM cell, transistors PD1 and PD2 typically have a width of 2.1μ and a length of 0.7μ. Transistors [PG1 and PG2] *TG1 and TG2* typically have a width of 0.9μ and a length of 0.8μ.

Figure 2:
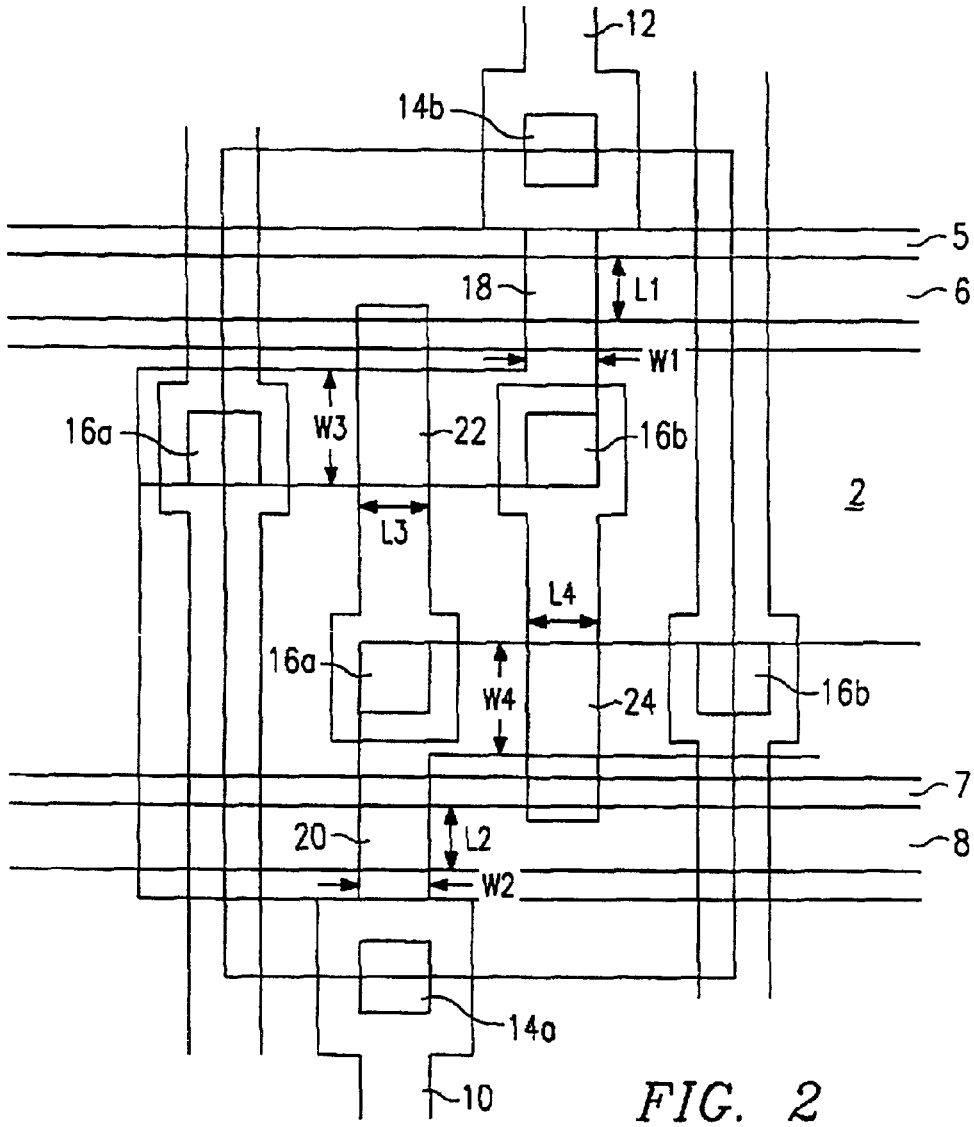
FIG. 2 is a layout of the SRAM cell depicted in FIG. 1.

Referring now to FIG. 2, a layout of SRAM cell 2 from FIG. 1 is depicted. SRAM cell 2 in FIG. 2 includes word lines 6 and 8, which are poly 1 lines. Bit lines 10 and 12 include bit line contacts 14a and 14b. In addition, SRAM cell 2 also has shared contacts 16a and 16b. Transistor TG1 includes a gate 18. Transistor TG1 has a width W1 and a length L1. Similarly, transistor TG2 has a gate 20 and a width W2 and a length L2. Pull-down transistor PD1 includes gate 22 and has a width W3 and a length L3; pull-down transistor PD2 includes gate 24 and has a width W4 and a length L4.

Figure 3B:
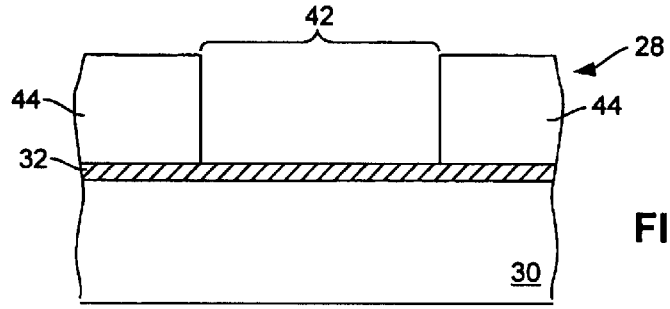
Figure 3C:
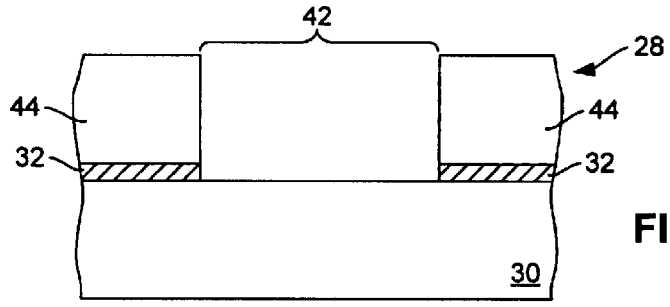

FIGS. 3A–3E are cross-section views of a transfer gate transistor and a pull-down transistor according to the present invention. Specifically, FIG. 3A is a cross-section view of a pull-down transistor 26, which includes a substrate 30 that is typically a monocrystalline silicon of a conventional crystal orientation known in the art. Many features of the present invention are applicable to devices employing semiconductor materials other than silicon as will be appreciated by those of ordinary skill in the art. Substrate 30 may be either a p-type substrate or an n-type substrate. In the present illustrative example, a p-type substrate is employed.

As can be seen in FIG. 3A, a gate structure has been formed, which includes gate oxide layer 32 and polysilicon layer 34. Source drain regions 36 have been implanted into substrate 30. Various types of implants may be employed; for example, n-type impurities may be implanted into a p-type substrate. Source drain region 36 are n-type active regions in the illustrated example. Lightly doped drain (LDD) regions 38 are defined using sidewall oxide spacers 40 as known by those skilled in the art. Alternatively, LDDs 38 and sidewall spacers 40 may be omitted.

Figure 3D:
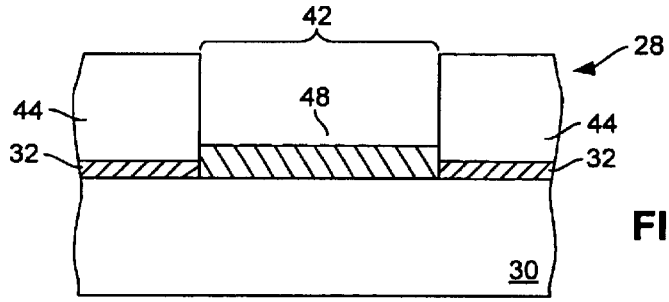

Transfer gate transistor 28 in FIG. 3B is at the same processing step as pull-down transistor 26 in FIG. 3A. After formation of the gate oxide 32 in FIG. 3A, the region in which transfer gate transistor 28 is to be formed is masked off. Thus, no processing is performed in the region of transfer gate transistor 28 while the rest of the pull-down transistor 26 is formed. As can be seen in this portion of SRAM cell 4, a window 42 has been opened in dielectric layer 44 exposing gate oxide layer 32. Dielectric layer 44 is an oxide in this example. Next, gate oxide layer 32 is etched away in FIG. 3C, exposing surface 46 of substrate 30. Thereafter, a new gate oxide layer 48 is grown on surface 46 of substrate 30 in window 42, as shown in FIG. 3D. This new gate oxide layer 48 preferably has a thickness less than that of the original gate oxide layer 32.

Thereafter, the gate of pull-down transistor 28 is formed as illustrated in FIG. 3E. The gate of pull-down transistor 28 includes gate oxide layer 48 and polysilicon layer 50. Source/drains 52 also are implanted in substrate 30. Source/drains 52 include LDDs 54, which are again defined using sidewall oxide spacers 56. The thickness of gate oxide 32 is greater than the thickness of gate oxide 48. This type of processing is employed to create transfer gate transistors and pull-down transistors with different gate oxide thicknesses, which allows for a reduction in the width of pull-down transistors in an SRAM cell.

Although the depicted embodiment illustrates completely etching away the gate oxide of pull-down transistor 28, then producing a gate oxide of the desired thickness, other methods of producing different gate oxides may be employed according to the present invention. For example, a gate oxide layer may be grown for transfer gate transistor 28 first, and then an additional gate oxide layer can be grown on both pull-down transistor 26 and transfer gate transistor 28 to produce gate oxide layers of different thicknesses for each of the transistors. Transfer gate transistor 28 is completely masked from processing after completion, and remains in the form depicted in FIG. 3A during the various processing steps applied to pull-down transistor 28 in FIGS. 3B–3C.

According to the present invention, a reduced width pull-down transistor dimension may be employed by adjusting the ratio of the gate oxide thickness between the transfer gate transistors and the pull-down transistors in the SRAM cell. The needed thicknesses of the two gate oxides may be selected using the following equation:

$$[\mathrm{RATIO} \le \frac{\mathrm{Tox_{tg}}}{\mathrm{Tox_{pd}}} \frac{\mathrm{W_{pd}}/\mathrm{L_{pd}}}{\mathrm{W_{tg}}/\mathrm{L_{tg}}} \frac{\mathrm{Vcc} - \mathrm{Vt_{tg}}}{\mathrm{Vcc} - \mathrm{Vt_{pd}}}]$$

$$RATIO \le \frac{Tox_{tg}}{Tox_{pd}} \frac{W_{pd}/L_{pd}}{W_{tg}/L_{tg}} \frac{Vcc - Vt_{pd}}{Vcc - Vt_{tg}}$$

where RATIO is the desired ratio of the transfer gate transistor and the pull-down transistor, $TOX_{tg}$ is the gate oxide thickness of the transfer gate transistor, $TOX_{pd}$ is the gate oxide thickness of the pull-down transistor, $W_{pd}$ is the width of the pull-down transistor, $L_{pd}$ is the length of the pull-down transistor, $W_{tg}$ is the width of the transfer gate transistor, $L_{tg}$ is the length of the transfer gate transistor, Vcc is the upper power supply voltage, $Vt_{tg}$ is the threshold voltage of the transfer gate transistor, and $Vt_{pd}$ is the threshold voltage of the pull-down transistor.

In the depicted example, RATIO is 2.6, VCC is equal to 3.3 volts, $Vt_{tg}$ is 0.9 volts with a back bias, and $Vt_{pd}$ is equal to 0.7 volts. If 0.5μ feature design rules are utilized (L equal 0.5μ, W equal 0.6μ), the pull-down transistor width is 1.56μ. If the pull-down gate oxide thickness is 120 Å, a 36% reduction in pull-down transistor width (1.0μ feature), will require a 134 Å transfer gate oxide thickness. A 50% reduction in pull-down transistor width (0.8μ feature) requires a 165 Å transfer gate oxide thickness. By reducing the width ($W_{pd}$) of the pull-down transistor, the overall area of SRAM cell may be reduced.

Figure 5:
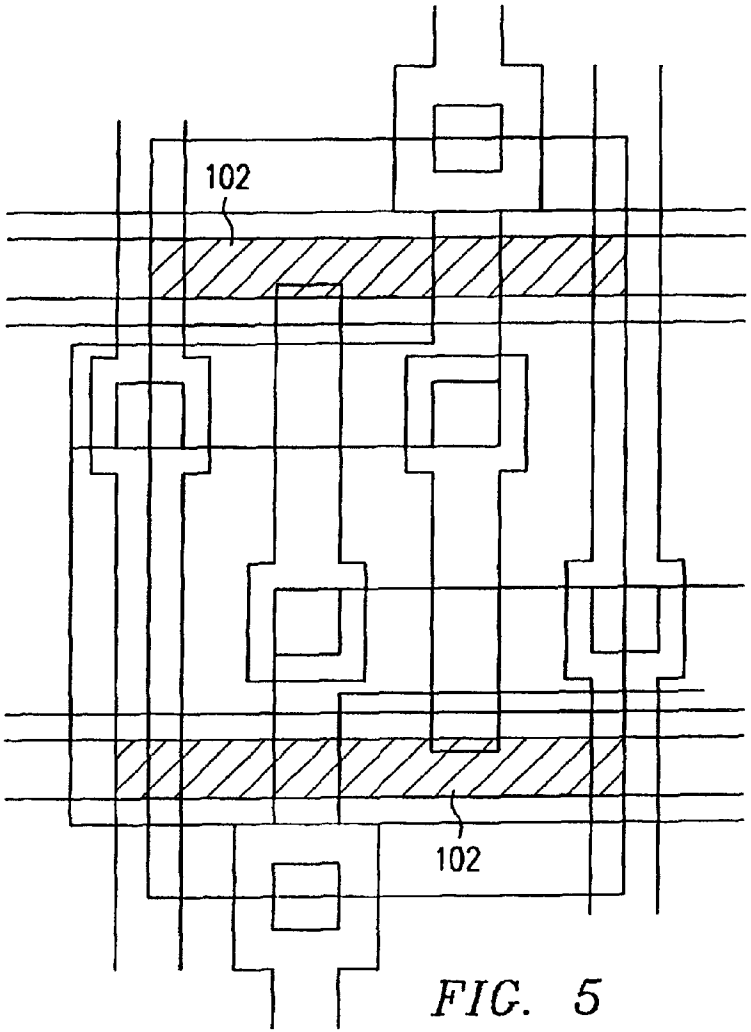
FIGS. 4–13 are layout diagrams of an SRAM during processing according to the present invention.
Figure 4:
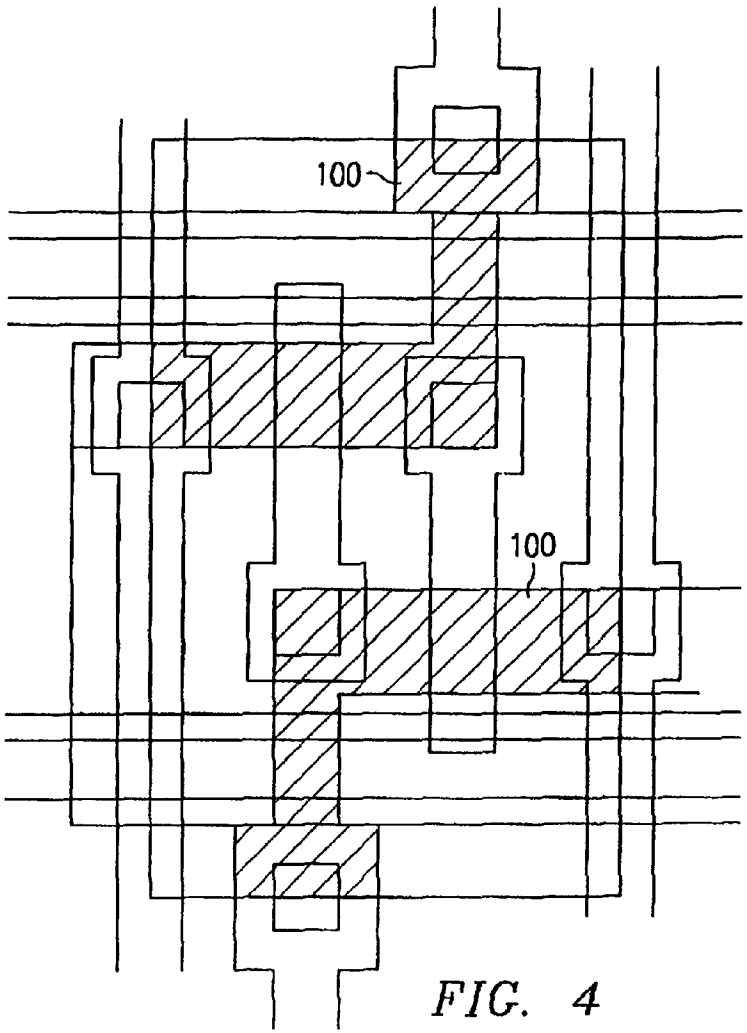
Figure 7:
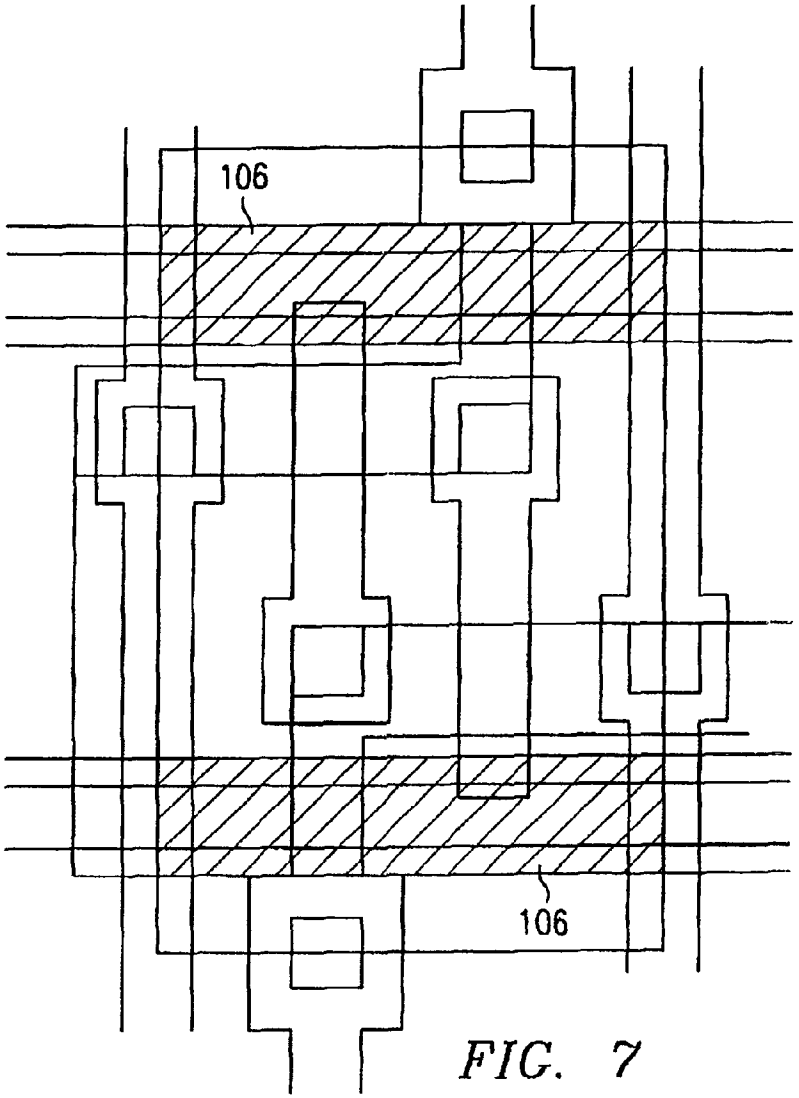
Figure 6:
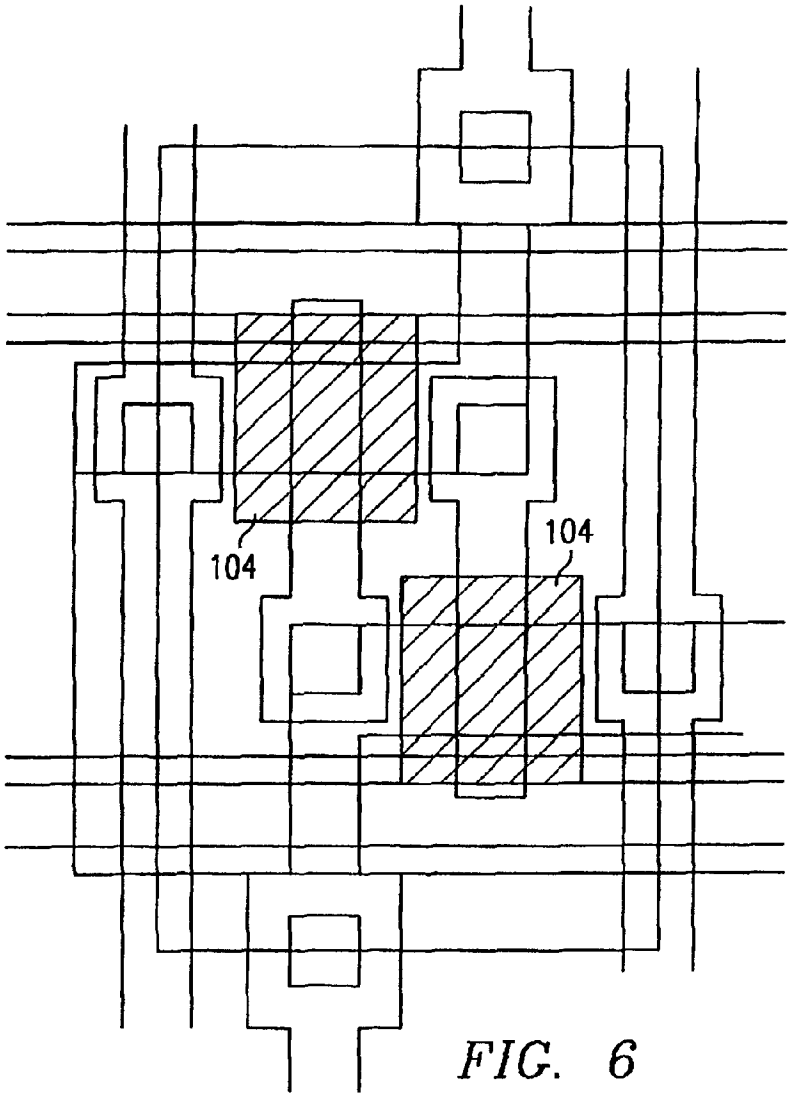
Figure 8:
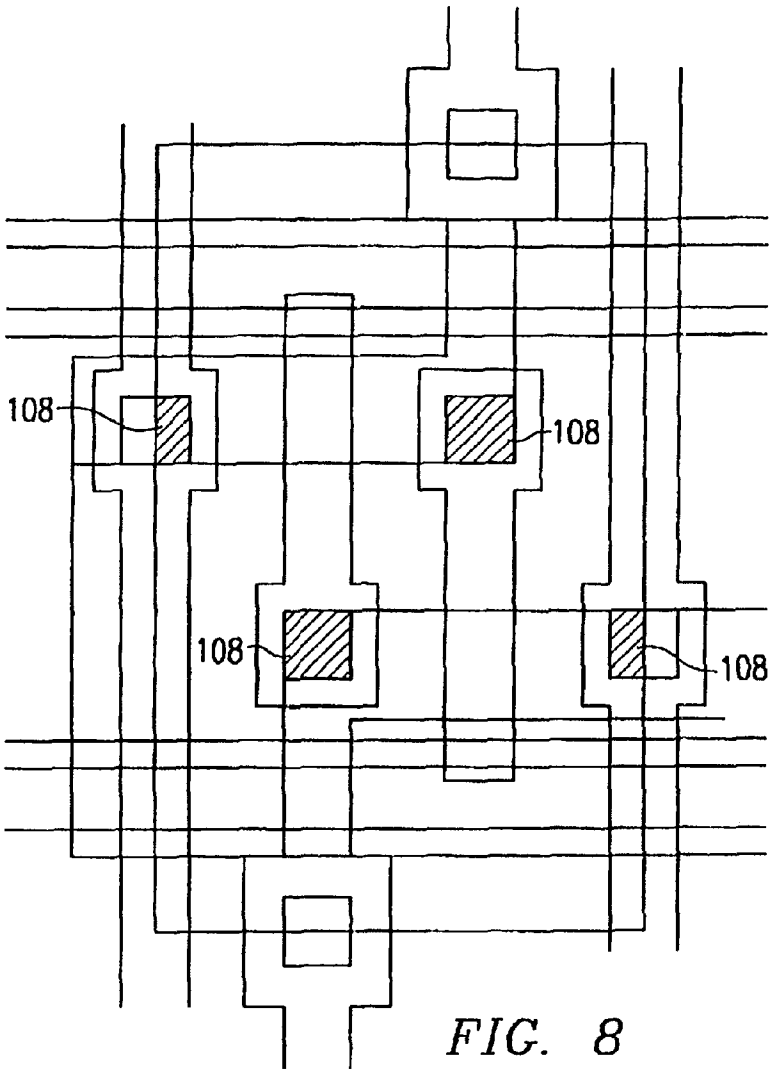

FIGS. 4–13 are layout diagrams of an SRAM cell during processing according to the present invention. In FIG. 4, SRAM cell 4 located on a wafer has been processed and is ready for gate oxide. Active areas 100 have been formed in the substrate of the wafer by growing a field oxide everywhere else. Transfer gate oxide is grown on the wafer and a poly 1 is deposited. In FIG. 5, the poly 1 is patterned for transfer gate transistors in areas 102. Drain/source implantation for the transfer gate transistors is performed with resist patterns blocking implant into pull-down transistor areas 104 in FIG. 6. Thereafter, a blanket threshold voltage adjust implant is performed for the pull-down transistors. Then undoped oxide is deposited on the wafer in a thickness of about 1000 Å. The undoped oxide is removed in FIG. 7. Undoped oxide in areas 106 are protected from removal with resist patterns to protect the poly 1, which causes only those areas 104 intended for the pull-down transistors to be exposed. The pull-down transistor gate oxide is grown; a thin buffer of poly is deposited in a layer of about 500 Å. In FIG. 8, resist patterns are utilized to open shared contacts in areas 108. Then, poly plus polycide is deposited for poly 2.

Figure 9:
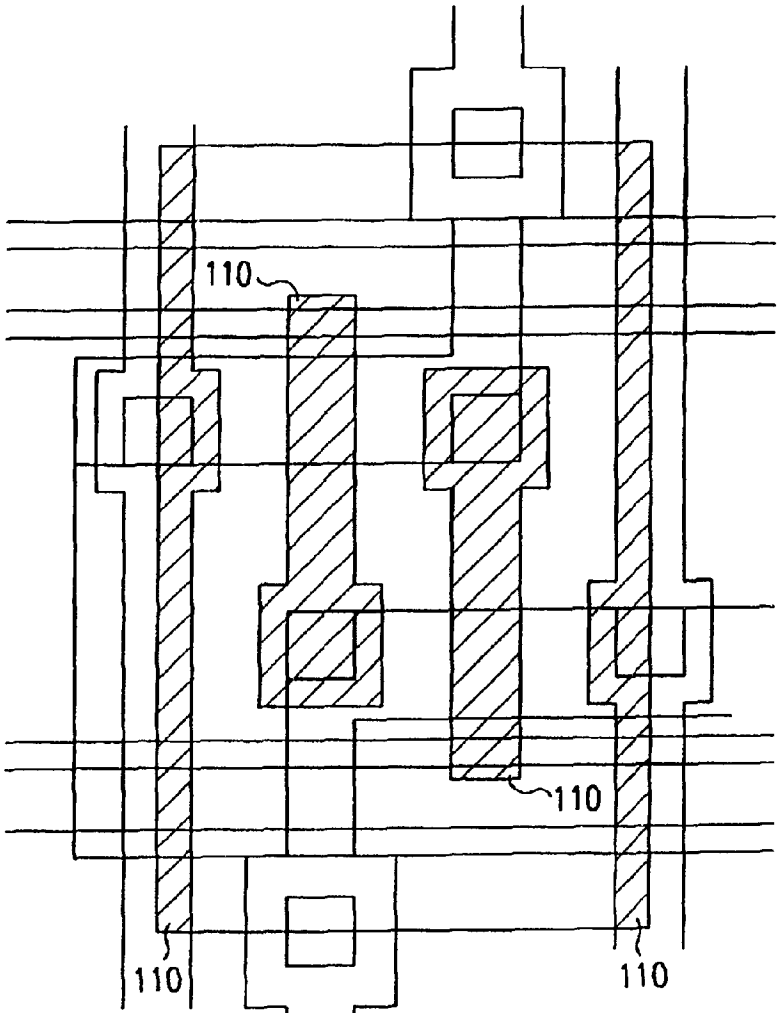
Figure 11:
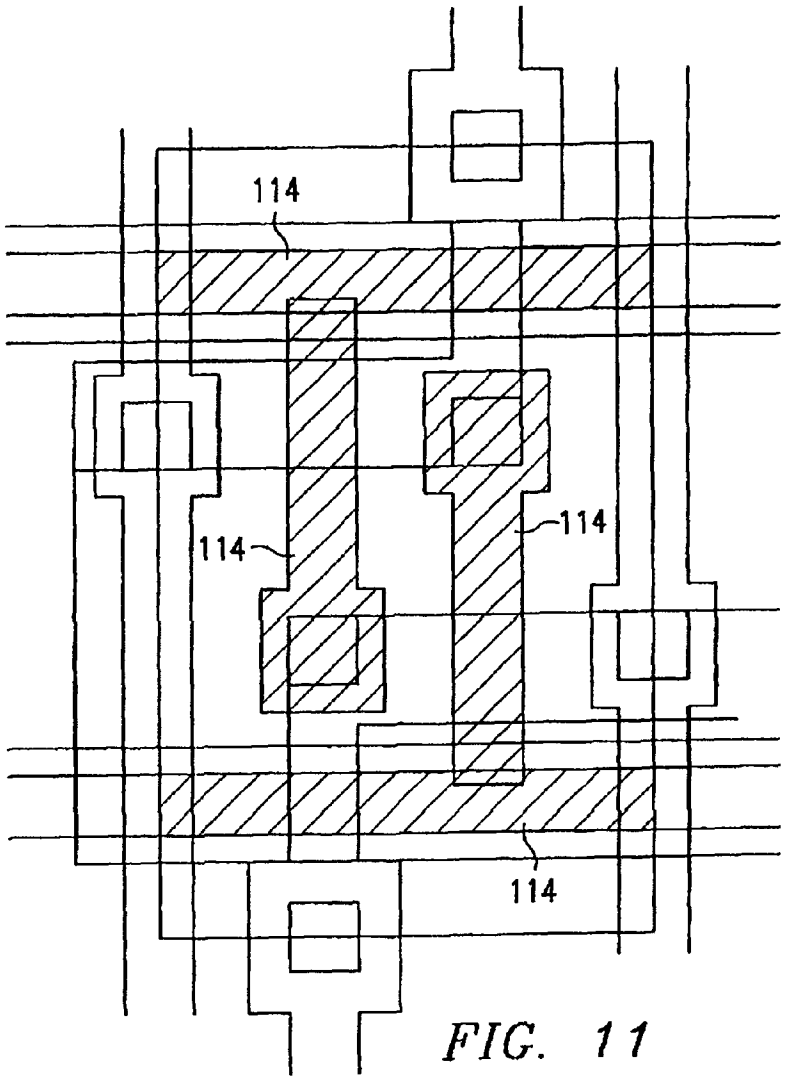
Figure 10:
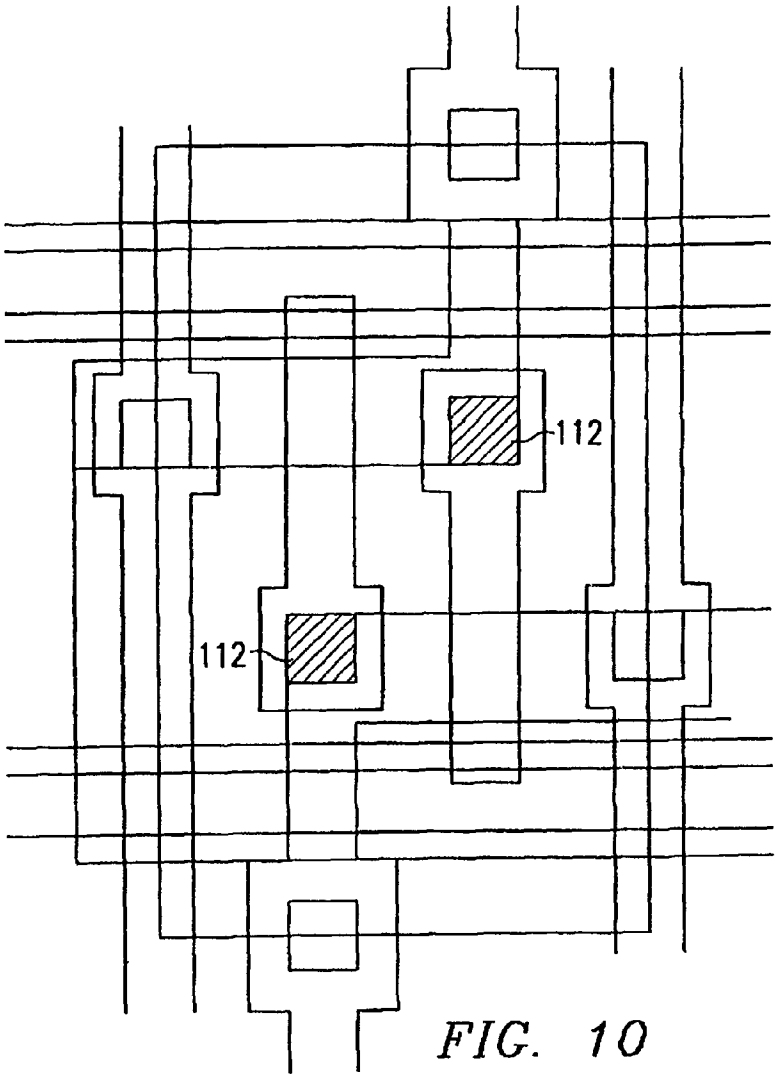
Figure 13:
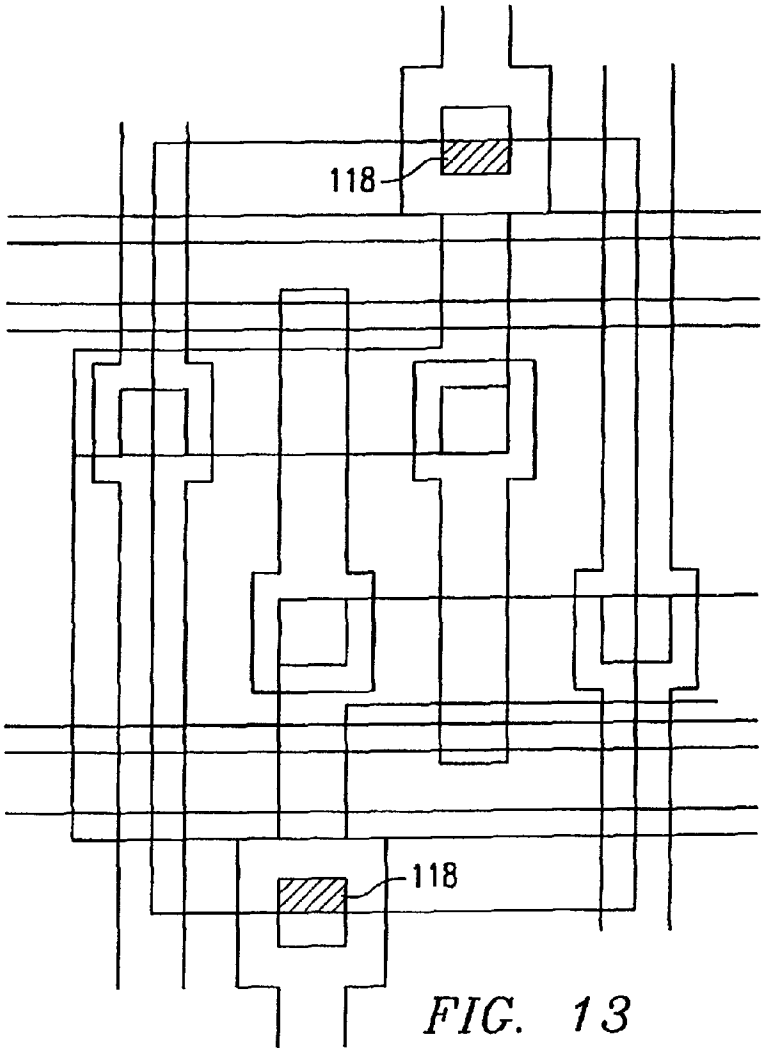
Figure 12:
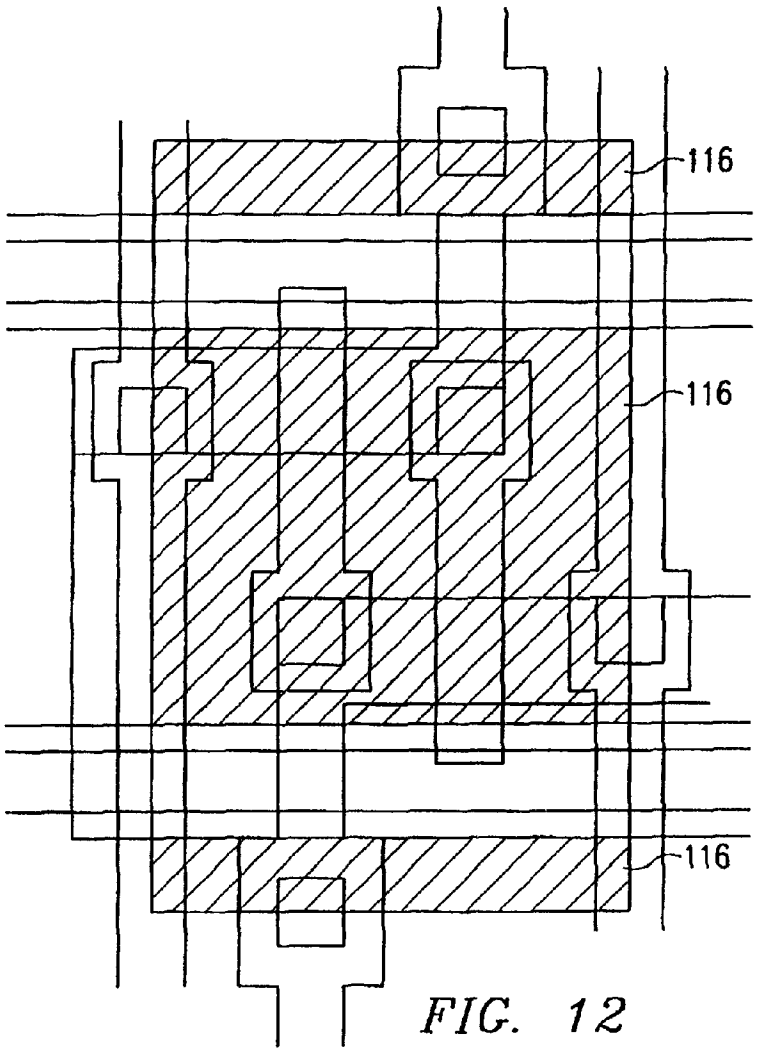

In FIG. 9, the poly 2 is patterned for pull-down transistors and the Vss line as shown in areas 110 in FIG. 9. Drain/source implantation is then performed for the pull-down transistors. Thereafter, a thin oxide is deposited over the wafer in a layer of about 700 Å. A spin-on-glass process is performed to create a glass layer of about 700 Å. This layer is cured and densified. Thereafter, thin glass is deposited on the wafer in a layer of about 700 Å. In FIG. 10, second shared contacts are opened using resist patterns to protect the rest of the SRAM cell from being opened. The second shared contacts are opened in areas 112. Then, undoped poly 3 is deposited in a layer of about 700 Å thick. In FIG. 11, the poly 3 is patterned with resist to remain in areas 114. This poly layer will be used for the SRAM cell pull-up resistors, and VCC supply lines. Undoped oxide is deposited in a layer of about 1000 Å on the wafer and a blanket implant for poly 3 is performed to set the poly resistor resistance on the wafer. Thereafter, a n+ implant is performed for the VCC portions of poly 3 utilizing a resist pattern covering areas 116 in FIG. 12. Contact windows are cut in areas 118 in FIG. 13.

Thus, the present invention provides a method and structure for reducing the overall cell area of a memory cell. The present invention provides an ability to reduce the area of a memory cell by allowing the widths of the pull-down transistors to be reduced. The reduction in width is accomplished according to the present invention by selecting different gate oxide thicknesses for the pull-down transistor and the transfer gate transistor to maintain the desired ratio.

Although the depicted embodiment defines specific numbers for ratios, widths, lengths, in other parameters may be utilized by those of ordinary skill in the art following this disclosure. In addition, the different gate oxide thicknesses for transistors in the SRAM memory cell may be applied to other types of memory cells in which widths or lengths of transistors can affect the area that a cell requires.

While the invention has been particularly shown and described with reference to a preferred embodiment, it will be understood by those skilled in the art that various changes in form and detail may be made therein without departing from the spirit and scope of the invention.

What is claimed is:

1. An SRAM memory cell comprising:

[a] first and second transfer gate transistors, the first transfer gate transistor having a first source/drain connected to a bit line and the second transfer gate transistor having a first source/drain connected to a complement bit line and each transfer gate transistor having a gate connected to a word line; [and]

first and second pull-down transistors configured as a storage latch, the first pull-down transistor having a first source/drain connected to a second source/drain of said first transfer gate transistor and the second pull-down transistor having a first source/drain connected to a second source/drain of said second transfer gate transistor, both first and second pull-down transistors having a second source/drain connected to a power supply voltage node; *and* wherein the first and second transfer gate transistors each have a first width and include a gate oxide layer having a first thickness, the first and second pull-down transistors each have a second width and include a gate oxide layer having a second thickness, and a product of the [first] *second* width and the first thickness is greater than or equal to a product of the [second] *first* width and the second thickness.

2. The SRAM memory cell of claim 1, wherein the first thickness is thicker than the second thickness.

3. The SRAM memory cell of claim 2, wherein the first thickness is greater than two times the second thickness.

4. The SRAM memory cell of claim 1, wherein the first and second thicknesses are determined as follows:

$$[\mathrm{RATIO} \le \frac{\mathrm{Tox_{tg}}}{\mathrm{Tox_{pd}}} \frac{\mathrm{W_{pd}}/\mathrm{L_{pd}}}{\mathrm{W_{tg}}/\mathrm{L_{tg}}} \frac{\mathrm{Vcc}-\mathrm{Vt_{tg}}}{\mathrm{Vcc}-\mathrm{Vt_{pd}}}]$$

$$RATIO \le \frac{Tox_{tg}}{Tox_{pd}} \frac{W_{pd}/L_{pd}}{W_{tg}/L_{tg}} \frac{Vcc-Vt_{pd}}{Vcc-Vt_{tg}}$$

where RATIO is the desired ratio of the transfer gate transistors and the pull-down transistors, $Tox_{tg}$ is the gate oxide thickness of the transfer gate transistor, $Tox_{pd}$ is the gate oxide thickness of the pull-down transistor, $W_{pd}$ is width of the pull-down transistor, $L_{pd}$ is the length of the pull-down transistor, $W_{tg}$ is the width of the transfer gate transistor, $L_{tg}$ is the length of the transfer gate transistor, $Vt_{tg}$ is the threshold voltage of the transfer gate transistor, and $Vt_{pd}$ is the threshold voltage of the pull-down transistor.

5. The SRAM memory cell of claim 4, wherein RATIO is equal to 2.6.

6. A semiconductor circuit comprising:

a first transistor having a first width and a first gate including a gate oxide layer having a first thickness; and a second transistor having a second width and a second gate including a gate oxide layer having a second thickness, wherein a product of the [second] *first* width and the second thickness is greater than a product of the [first] *second* width and the first thickness.

7. The semiconductor circuit of claim 6, wherein the first transistor is a pull-down transistor in an SRAM memory cell.

8. The semiconductor circuit of claim 7, wherein the second transistor is a transfer gate transistor in the SRAM memory cell.

9. The semiconductor circuit of claim 8, wherein the gate oxide thickness of the pull-down transistor and a transfer gate transistor in the SRAM memory cell are selected using the following:

$$[\mathrm{RATIO} \le \frac{\mathrm{Tox_{tg}}}{\mathrm{Tox_{pd}}} \frac{\mathrm{W_{pd}}/\mathrm{L_{pd}}}{\mathrm{W_{tg}}/\mathrm{L_{tg}}} \frac{\mathrm{Vcc}-\mathrm{Vt_{tg}}}{\mathrm{Vcc}-\mathrm{Vt_{pd}}}]$$

$$RATIO \le \frac{Tox_{tg}}{Tox_{pd}} \frac{W_{pd}/L_{pd}}{W_{tg}/L_{tg}} \frac{Vcc-Vt_{pd}}{Vcc-Vt_{tg}}$$

where RATIO is the desired ratio of the transfer gate transistors and the pull-down transistors, $Tox_{tg}$ is the gate oxide thickness of the transfer gate transistor, $Tox_{pd}$ is the gate oxide thickness of the pull-down transistor, $W_{pd}$ is width of the pull-down transistor, $L_{pd}$ is the length of the pull-down transistor, $W_{tg}$ is the width of the transfer gate transistor, $L_{tg}$ is the length of the transfer gate transistor, $Vt_{tg}$ is the threshold voltage of the transfer gate transistor, and $Vt_{pd}$ is the threshold voltage of the pull-down transistor.

10. The semiconductor circuit of claim 9, wherein RATIO is at least 2.6.

11. The semiconductor circuit of claim 10, wherein the pull-down transistor is an n-channel field effect devices.

12. The semiconductor circuit of claim 10, wherein the transfer gate transistor is an n-channel field effect device.

*13. A semiconductor circuit, comprising:*

*a first transistor including a first gate having a first width and including a first gate insulator having a first thickness; and*

*a second transistor including a second gate having a second width and including a second gate insulator having a second thickness, a product of the first width and the second thickness being greater than or equal to a product of the second width and the first thickness.*

*14. The semiconductor circuit of claim 13 wherein the first transistor comprises a pull-down transistor.*

*15. The semiconductor circuit of claim 13 wherein the second transistor comprises a transfer gate transistor.*

*16. The semiconductor circuit of claim 13 wherein the product of the first width and the second thickness is greater than the product of the second width and the first thickness.*

*17. A semiconductor circuit, comprising:*

*a first transistor including a first channel region having a first width and including a first gate insulator having a first thickness; and*

*a second transistor including a second channel region having a second width and including a second gate insulator having a second thickness, a product of the first width and the second thickness being greater than or equal to a product of the second width and the first thickness.*

*18. The semiconductor circuit of claim 17 wherein the first transistor comprises a pull-down transistor.*

*19. The semiconductor circuit of claim 17 wherein the second transistor comprises a transfer gate transistor.*

*20. The semiconductor circuit of claim 17 wherein the product of the first width and the second thickness is greater than the product of the second width and the first thickness.*

*21. A memory cell, comprising:*

*a pull-down transistor including a first gate having a first width and including a first gate insulator having a first thickness; and*

*a transfer gate transistor coupled to the pull-down transistor and including a second gate having a second width and including a second gate insulator having a second thickness, a product of the first width and the second thickness being greater than or equal to a product of the second width and the first thickness.*

*22. A memory cell, comprising:*

*a pull-down transistor including a first channel region having a first width and including a first gate insulator having a first thickness; and*

*a transfer gate transistor including a second channel region having a second width and including a second gate insulator having a second thickness, a product of the first width and the second thickness being greater than or equal to a product of the second width and the first thickness.*

* * * * *